(12) United States Patent
Karpov et al.

(10) Patent No.: US 8,971,089 B2
(45) Date of Patent: Mar. 3, 2015

(54) LOW POWER PHASE CHANGE MEMORY CELL

(75) Inventors: Elijah V. Karpov, Portland, OR (US); Kuo-Wei Chang, Cupertino, CA (US); Gianpaolo Spadini, Los Gatos, CA (US)

(73) Assignee: Intel Corporation, Santa Clara, CA (US)

( * ) Notice: Subject to any disclaimer, the term of this patent is extended or adjusted under 35 U.S.C. 154(b) by 437 days.

(21) Appl. No.: 13/534,267

(22) Filed: Jun. 27, 2012

(65) Prior Publication Data

US 2014/0003123 A1    Jan. 2, 2014

(51) Int. Cl.
*G11C 11/00*    (2006.01)
*H01L 45/00*    (2006.01)
*H01L 27/24*    (2006.01)

(52) U.S. Cl.
CPC ............. *H01L 45/144* (2013.01); *H01L 45/06* (2013.01); *H01L 45/1233* (2013.01); *H01L 27/2409* (2013.01); *H01L 27/2427* (2013.01)
USPC ...................... 365/148; 365/185.18; 365/163

(58) Field of Classification Search
CPC ........... G11C 11/5678; G11C 13/0002; G11C 17/165
USPC .................................. 365/148, 185.18, 163
See application file for complete search history.

(56) References Cited

U.S. PATENT DOCUMENTS

| | | | |
|---|---|---|---|
| 7,135,696 B2 | 11/2006 | Karpov et al. | |
| 7,233,054 B1 | 6/2007 | Anh et al. | |
| 7,359,231 B2 | 4/2008 | Venkataraman et al. | |
| 7,573,058 B2 | 8/2009 | Noh et al. | |
| 7,889,544 B2 | 2/2011 | Chow et al. | |
| 7,906,774 B2 | 3/2011 | Chin et al. | |
| 8,134,860 B2 | 3/2012 | Wicker | |
| 8,351,240 B2 * | 1/2013 | Park et al. | 365/148 |
| 2004/0113137 A1 | 6/2004 | Lowrey | |
| 2005/0002227 A1 * | 1/2005 | Hideki et al. | 365/163 |
| 2006/0073652 A1 | 4/2006 | Pellizzer et al. | |
| 2006/0227592 A1 | 10/2006 | Parkinson et al. | |
| 2007/0041245 A1 | 2/2007 | Ahn | |
| 2007/0221905 A1 | 9/2007 | Liu | |
| 2008/0165569 A1 | 7/2008 | Chen et al. | |
| 2008/0310211 A1 | 12/2008 | Toda et al. | |
| 2009/0072218 A1 | 3/2009 | Savransky et al. | |

(Continued)

FOREIGN PATENT DOCUMENTS

CN   1841558 A   10/2006
TW   I296435 B   5/2006

(Continued)

OTHER PUBLICATIONS

Bedeschi, et al., "A Bipolar-Selected Phase Change Memory Featuring Multi-Level Cell Storage", IEEE Journal of Solid-State Circuits, vol. 44, No. 1, Jan. 2009, pp. 217-227.

(Continued)

*Primary Examiner* — Tuan T Nguyen
(74) *Attorney, Agent, or Firm* — Alpine Technology Law Group

(57) ABSTRACT

A memory may include two electrodes and phase change material having an amorphous reset state and a partially crystalized set state, coupled between the two electrodes. The phase change material in the set state may have a highly nonlinear current-voltage response in a subthreshold voltage region. The phase change material may be an alloy of indium, antimony, and tellurium.

22 Claims, 3 Drawing Sheets

(56) References Cited

U.S. PATENT DOCUMENTS

| | | | |
|---|---|---|---|
| 2009/0114898 A1 | 5/2009 | Ricker | |
| 2010/0182827 A1 | 7/2010 | Kostylev et al. | |
| 2010/0214829 A1 | 8/2010 | Breitwisch et al. | |
| 2010/0232205 A1 | 9/2010 | Parkinson | |
| 2010/0328995 A1* | 12/2010 | Shih et al. | 365/163 |
| 2010/0328996 A1* | 12/2010 | Shih et al. | 365/163 |
| 2011/0134685 A1 | 6/2011 | Kau et al. | |
| 2012/0140553 A1 | 6/2012 | Kalb et al. | |
| 2012/0147668 A1 | 6/2012 | Song et al. | |
| 2013/0094285 A1* | 4/2013 | Park et al. | 365/163 |

FOREIGN PATENT DOCUMENTS

| | | |
|---|---|---|
| WO | 2011/071594 A2 | 6/2011 |
| WO | 2011/071594 A3 | 8/2011 |

OTHER PUBLICATIONS

International Search Report and Written Opinion Received for PCT Patent Application No. PCT/US2010/052833, Mailed on Jul. 1, 2011, 9 pages.

Kau, et al., "A stackable cross point phase change memory", IEEE, International Electron Devices Meeting, Baltimore, MD, Dec. 9, 2009, pp. 617-620.

Czubatyj, et al., "Current Reduction in Ovonic Memory Devices," Proceedings of the European Phase Change and Ovonic Science Symposium, Grenoble, France, May 2006, 10 pages.

Notice of Allowance received for U.S. Appl. No. 12/653,092, mailed on Jun. 12, 2012, 9 Pages.

Corrected Notice of Allowability received for U.S. Appl. No. 12/653,092, mailed on Sep. 7, 2012, 2 Pages.

Corrected Notice of Allowability received for U.S. Appl. No. 12/653,092, mailed on Oct. 2, 2012, 2 Pages.

Notice of Allowance received for U.S. Appl. No. 12/653,092, mailed Nov. 2, 2012, 7 Pages.

International Preliminary Report Received for PCT Patent Application No. PCT/US2010/052833, Mailed on Jun. 21, 2012, 6 pages.

International Search Report and Written Opinion Received for Patent Application No. PCT/US2013/045936, mailed on Sep. 27, 2013, 14 Pages.

Office Action Received for Chinese Patent Application No. 2010105840549, mailed on Feb. 5, 2013, 7 pages of Office Action and 9 pages of English translation.

* cited by examiner

LOW POWER PHASE CHANGE MEMORY CELL

BACKGROUND

1. Technical Field

The present subject matter relates to semiconductor phase change memory, and more specifically, to a low power phase change memory cell to use in a phase change memory with switch (PCMS) semiconductor memory.

2. Background Art

Memory for computers or other electronic devices can include blocks of memory cells integrated into a larger integrated circuit or stand-alone integrated circuits. There are many different types of memory including random-access memory (RAM), read only memory (ROM), dynamic random access memory (DRAM), static RAM (SRAM), synchronous dynamic RAM (SDRAM), flash memory and phase change memory. Phase change memory devices utilize materials that have different electrical properties in their crystalline and amorphous phases. Each phase change memory cell may be programmed by putting the material in the memory cell into either a crystalline phase or an amorphous phase providing non-volatile memory that does not require power to retain its contents. Phase change memories are often programmed using heat generated by an electrical current to control the state of the phase change material.

Phase change memory cells may be made from chalcogenide materials. Chalcogenide materials include at least one element from group 16 (also known as Group VI A) of the periodic table, such as sulfur (S), selenium (Se), and tellurium (Te). Chalcogenide phase change material, when heated to a temperature above its melting point and allowed to cool quickly, will remain in an amorphous glass-like state with a high electrical resistance. The chalcogenide phase change material, when heated to a temperature above its glass transition temperature $T_g$ but below the melting point, will transform into a crystalline phase with a much lower resistance. This difference in the material properties between the amorphous and crystalline phases of chalcogenide materials may be used to create a phase change memory device.

BRIEF DESCRIPTION OF THE DRAWINGS

The accompanying drawings, which are incorporated in and constitute part of the specification, illustrate various embodiments. Together with the general description, the drawings serve to explain various principles. In the drawings.

DETAILED DESCRIPTION

In the following detailed description, numerous specific details are set forth by way of examples in order to provide a thorough understanding of the relevant teachings. However, it should be apparent to those skilled in the art that the present teachings may be practiced without such details. In other instances, well known methods, procedures and components have been described at a relatively high-level, without detail, in order to avoid unnecessarily obscuring aspects of the present concepts. A number of descriptive terms and phrases are used in describing the various embodiments of this disclosure. These descriptive terms and phrases are used to convey a generally agreed upon meaning to those skilled in the art unless a different definition is given in this specification. Reference now is made in detail to the examples illustrated in the accompanying drawings and discussed below.

Figure 1A:
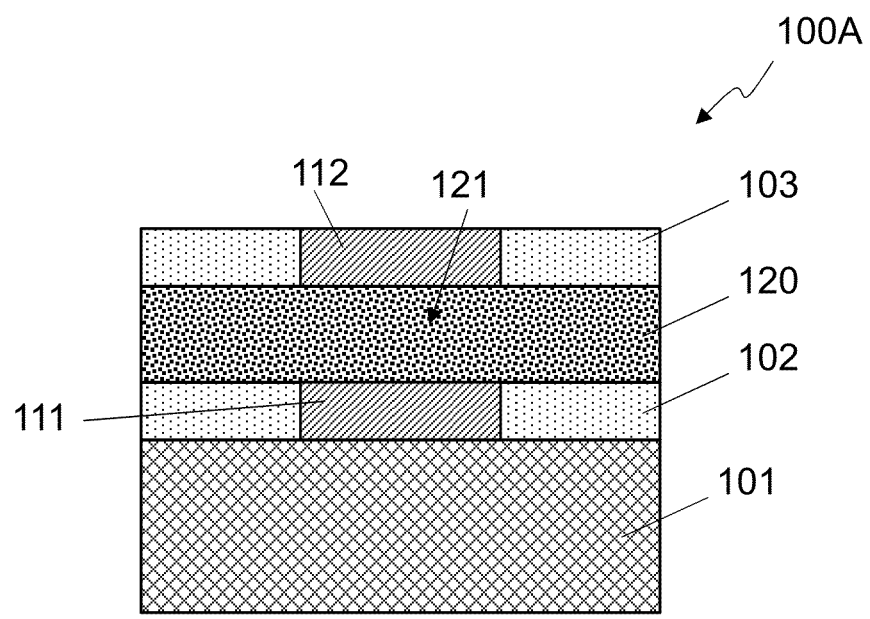
FIGS. 1A and 1B show a cross-sectional diagram of an embodiment of a phase change memory element in the reset state and set state, respectively.
Figure 1B:
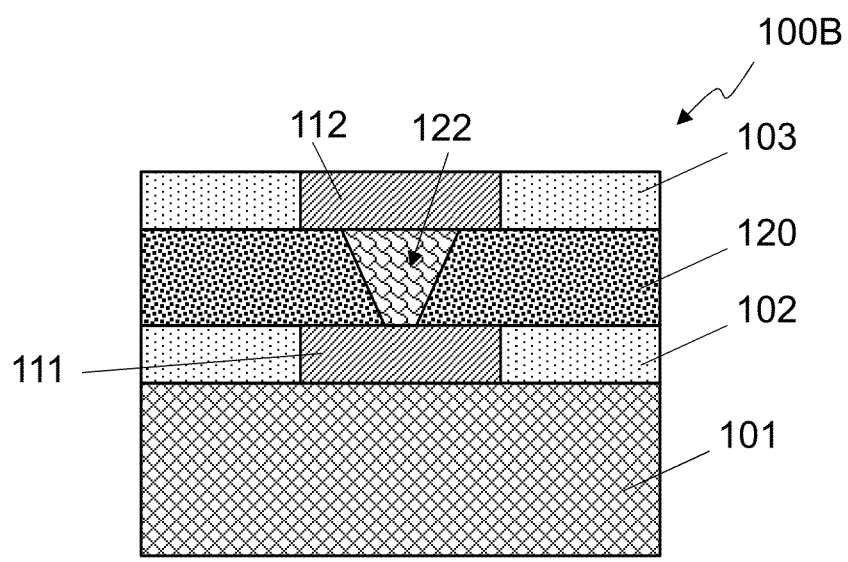

FIGS. 1A and 1B show a cross-sectional diagram of an embodiment of a phase change memory element in the reset state 100A and set state 100B, respectively. The phase change memory element 100A/B may be a part of a cross-point memory array, and may be fabricated on a semiconductor substrate 101 that may include various layers, patterns, doping levels, or other materials and may include circuitry, conductors, and/or insulators. A first electrode 111 may be created on the substrate 101 and may be separated by an insulating layer 102 such as an oxide from other conductors or circuitry in some embodiments. A layer of phase change material 120 may be deposited over the first electrode 111. The phase change material may be in a non-conductive or highly resistive amorphous reset state so that the phase change material of the memory element 121/122, is insulated from neighboring memory elements. In some embodiments the phase change material may be patterned, with little if any phase change material outside of the memory cell area, but some embodiments may have large areas of a die covered by an unpatterned layer of phase change material, taking advantage of the non-conductive state of the amorphous phase change material to insulate the memory cells or other elements from each other. A second electrode 112, which may be separated from other conductors by an insulating layer 103, may be deposited on top of the phase change material 120. In other embodiments, the layout of the memory cell may be horizontal instead of vertical, with the two electrodes on opposite sides of the phase change material of the memory cell.

The phase change material 120 has an amorphous reset state which may be the state of the phase change material 120 as it is deposited on the memory device. The phase change material 120 may be essentially non-conductive in the amorphous reset state, which may be defined as having a resistance of greater than about 1,000 mega-ohms (MΩ) for typical geometries of the phase change material. The thickness of the phase change material 120 may vary between embodiments but may be between about 30 nanometers (nm) and 100 nm in some embodiments. The area of the electrodes 111, 112 may also affect the resistance and the area of the electrodes may vary between embodiments, but some embodiments may have electrodes that are between about 10 nm and about 100 nm on a side. The section of the phase change material 121 positioned between the two electrodes 111,112 may be in the amorphous state in FIG. 1A, so that the resistance between the two electrodes 111,112 may be greater than about 1,000 MΩ.

Traditional phase change materials may form a fully crystalized state which may have a relatively low resistance, such as below 1,000 ohms at typical geometries, and may not have a threshold voltage. The threshold voltage may be defined as a voltage at which the resistivity of the phase change material dramatically changes. The phase change materials described herein may partially crystalize and may have a threshold voltage, similar to an ovonic threshold switch (OTS), so the phase change material 120 also has a partially crystalized set state. In FIG. 1B, the memory 100B is in the set state, so the section of the phase change material 122 positioned between the two electrodes 111,112 is in the partially crystalized state.

Figure 2:
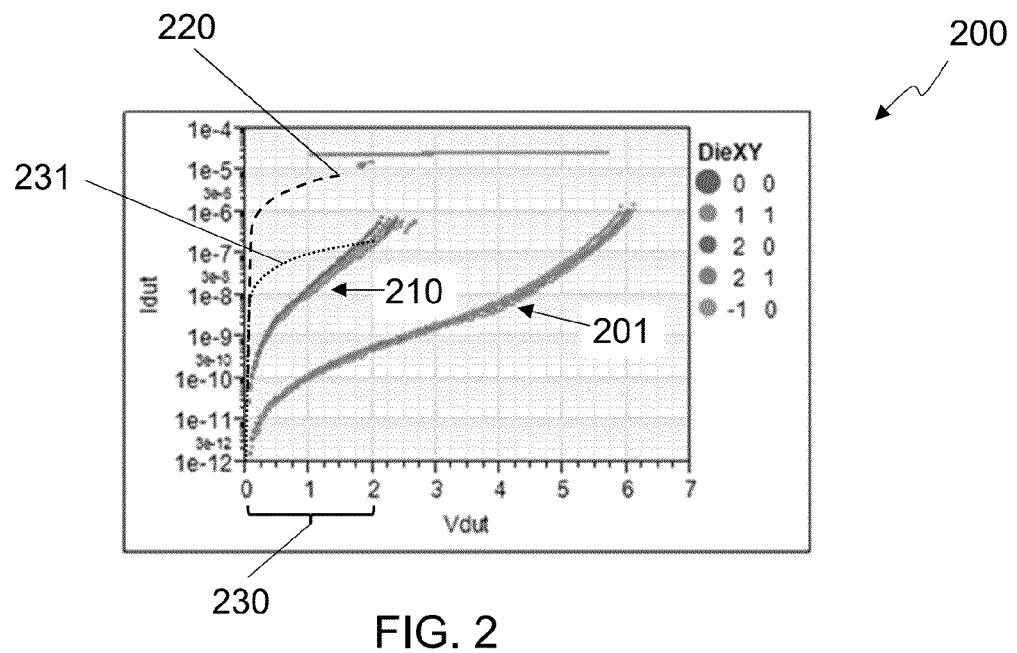
FIG. 2 shows a graph of current-voltage response of a phase change material useful for embodiments.

In the partially crystalized state, the phase change material 122 may have a highly nonlinear current-voltage response at subthreshold voltage levels, as is shown in FIG. 2. The resistance of the phase change material between the two electrodes 111,112 may be greater than about 100-200 kilo-ohms (kΩ), and more than 1 MΩ in some embodiments, at typical geometries at subthreshold voltage levels, such as less than about 1.5 V for some phase change materials 120 in the partially crystalized set state.

Various material compositions may be used for the phase change material 120. The inventors believe that a wide range of phase change materials may be suitable for the embodiments described herein. The phase change material may be a chalcogenide material and may include tellurium. In some embodiments, the phase change material may be an alloy of indium (In), germanium (Ge) and tellurium (Te), which may be referred to as an IGT alloy, although other elements may be included for some IGT alloys. In some embodiments the phase change material may be an alloy of indium (In), antimony (Sb), and tellurium (Te), which may be referred to as an IST alloy, although other elements may be included for some IST alloys. IST alloys that may be suitable for embodiments may include IST alloys with atomic percentages of between about 25% and about 40% indium (In), between about 1% and about 15% antimony (Sb), and between about 50% and about 70% tellurium (Te).

The phase change material 120 may be changed from the amorphous reset state to the partially crystalized state by heating the phase change material to a specific temperature for a predefined period of time. The phase change materials described herein may use less power to reset the phase change material from the set state to the reset state due to due to self-heating effects caused by the relatively high resistance of the phase change material 120 in the set state. In traditional phase change materials, a programming current of in excess of 1 milli-amp (mA) may be used to convert the phase change material from the set state back to the reset state due to the low resistance of traditional phase change materials in the fully crystalized set state. The phase change material 120 may use less than 200 micro-amps (μA) of current, and in some cases less than 100 μA of current, to change the phase change material of the memory in the partially crystallized set state 122, to the amorphous reset state 121. This may be due to the much higher resistance of the phase change material in the set state 122 as compared to traditional phase change materials. In at least one embodiment, a pulse of current of less than about 200 μA through the phase change material, for less than about 100 ns, may change the phase change material from the set state to the reset state, which may be much less power than traditional phase change materials may use to perform a reset.

The higher resistance of the set state in the phase change material 120 may also reduce leakage current of the phase change memory cell. This may allow lower power devices to be fabricated and/or larger memory cells may be constructed. The higher threshold voltage of the phase change material in the set state 122 as compared to traditional phase change materials may also increase blocking margin for embodiments using a phase change memory with switch (PCMS) architecture.

FIG. 2 shows a graph 200 of current-voltage response of a phase change material useful for embodiments. The graph 200 shows a voltage level on the x-axis using a linear scale and a current level on the y-axis using a logarithmic scale. Data was collected at several places in an array of phase change memory on a test chip using an exemplary IST alloy as described above, and is shown in the graph 200. The reset response curve 201 represents the amount of current that was found to flow through the phase change material at a given voltage level if the phase change material was in the amorphous reset state. The set response curve 210 represents the amount of current that was found to flow through the phase change material at a given voltage level if the phase change material was in the partially crystalized set state.

The set response curve 210 of the phase change material in the partially crystalized set state is highly nonlinear. A linear response is shown by the curve 231, which would be a straight line if it were plotted on a graph with a linear x-axis and a linear y-axis. For the purposes of this disclosure and claims, a current voltage response may be considered to be highly nonlinear in the subthreshold region 230 if the curve departs more than about −50% or about +100% from a linear response at one or more voltage levels in the subthreshold region 230. This means that the resistance of the phase change material, which may be defined as voltage/current, is strongly dependent on voltage. The subthreshold voltage region, which may vary between phase change materials, is a range of voltages that are below an amount of voltage that may be required to activate the ovonic switch response of the phase change material in the partially crystalized set state, which may also be referred to as a threshold voltage. So a subthreshold voltage level may be any voltage in range between about 0 volts (V) and the threshold voltage of a phase change material. In the example shown, the subthreshold region 230 may be a voltage range of about 0 V to about 2 V. So the linear response curve 231 represents a linear response from the origin to a point on the set response curve 210 at about 2 V. It can be easily seen that the set response curve 210 departs dramatically from the linear response curve. For example, at about 0.25 V, the set response curve 210 yields a current of about $6 \times 10^{-10}$ amps (A), while the linear response curve 231 yields a current of about $2 \times 10^{-8}$ A, so at that point, the set response curve departs from the linear response curve 231 by about −97%.

A high resistance of the phase change material in the partially crystalized set state may be a characteristic of a suitable material. The resistance may be measured at any point in the subthreshold region 230 and the characteristic of a high resistance may vary between embodiments. But in at least some embodiments, a resistance over 100 kΩ, may be considered a high resistance, with some embodiments of phase change materials having a set state resistance of 1 mega-ohm (MΩ) or higher. The high resistance may be exhibited over an entire subthreshold voltage rage, but in at least one embodiment, the resistance of the phase change material in the set state may be greater than about 200 kΩ at voltages of less than about 1.5 V, which is represented by 200 kΩ curve 220 on the graph 200, which may represent the amount of current that would flow through a 200 kΩ resistor at a given voltage. So a material with a set response curve 210 that is below the 200 kΩ curve 220 may have a high resistance in the set state. In other embodiments, the resistance of the phase change material in the set state may be greater than about 1 MΩ, so less than about 1 uA of current may flow through the phase change material if the voltage across the material is about 1.5 V.

If the voltage across the phase change material in the set state is increased beyond the subthreshold range to a threshold voltage, the resistance of the phase change material in the set state may quickly reduce dramatically. In various embodiments the reduction of the resistance may be more than an order of magnitude if the voltage reaches a threshold voltage. The threshold voltage may vary in embodiments, but may be in a range of about 1.5 V to about 3 volts, depending on the composition of the phase change material. Once the threshold voltage is reached and the resistance drops, the current may rise dramatically, which may cause the voltage to reduce due to limits of the voltage source and/or source resistance, which may be referred to as snapback. The resistance may stay at a low level until the voltage across the phase change material drops below a holding voltage. One the voltage drops below the holding voltage, the resistance may rise to its former high value.

Figure 3:
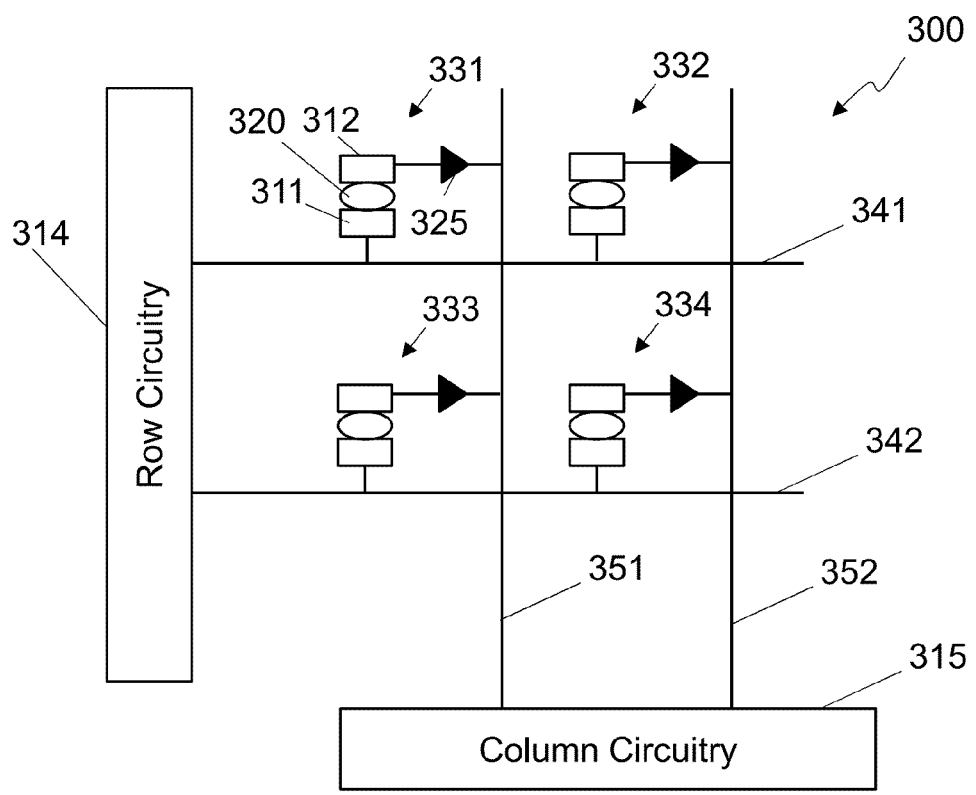
FIG. 3 shows an array of phase change memory cells including access devices and associated circuitry for various embodiments.

FIG. 3 shows an array 300 of phase change memory cells including access devices, or phase change memory with switch (PCMS) cells 331-334, and associated circuitry 314, 315 for various embodiments. The array 300 shows four PCMS cells 331-334 with two word lines 341, 342 and two bit lines 351, 352, although most embodiments may contain a much greater number of cells and associated word lines and bit lines. PCMS cell 331 may be representative of other PCMS cells 332-334. PCMS 331 may include two electrodes that may be referred to as a first electrode 311 and a second electrode 312, phase change material 320 coupled between the two electrodes 311, 312, and an access device (or switch) 325. The phase change material 320 may have a highly nonlinear IV curve at subthreshold voltage levels as shown in FIG. 2 and may have an amorphous reset state and a partially crystalized set state. The access device 325 may be any type of device suitable for integration into the array 300, including, but not limited to, an ovonic threshold switch (OTS), a transistor, a semiconductor diode, or other device that is capable of regulating the current that passes through the phase change material 320. An OTS may be made of a chalcogenide alloy that does not exhibit an amorphous to crystalline phase change and which undergoes rapid, electric field initiated change in electrical conductivity that persists only so long as a holding voltage is present. Some embodiments may not include an access device as a part of the memory cells in the array 300. The access device 325 may be electrically coupled between the word line 341 and the first electrode 311, or the access device 325 may be electrically coupled between the second electrode 312 and the bit line 351, depending on the embodiment.

Row circuitry 314 may drive the word lines 341, 342 and column circuitry 315 may be coupled to the bit lines 351, 352. A particular combination of word line 341, 342 and bit line 352, 352 may select a particular PCMS cell to be read. For example, to select PCMS cell 331, word line 341 and bit line 351 may be used. Some embodiments may have an additional set of control lines for programming the memory cells by changing the phase change material between the amorphous reset state and the partially crystalized set state. The additional set of control lines may be parallel to the bit lines 351, 352 that couple directly to the second electrodes of a column or cells, such as the second electrode 312 of cell 331 and the second electrode of cell 333. In other embodiments, the first electrode 311 may be a heater element and may have other control lines may be coupled to the first electrode 311 to allow current to flow through the first electrode 311 to heat the phase change material 320.

The row circuitry 314 and/or column circuitry 315 may implement several functions, depending on the embodiment. Different embodiments may implement the various functions in either the row circuitry 314 of the column circuitry 315 or may utilize both the row circuitry 314 and column circuitry 315 to implement a function. Circuitry to provide appropriate voltage and/or current to the word lines 341, 342, bit lines 351, 352, and/or other control lines, may be implemented in the row circuitry 314 and/or column circuitry 315, so that the various memory cells, such as PCMS cell 331, may be written to and read. Reading may be accomplished by applying a demarcation voltage across the memory cell and determining whether or not current flows through the memory cell or by comparing the resistance of the phase change material 320 to a known resistance. Data may be written to the memory cells by heating the phase change material 320 to an appropriate temperature to change the material from the amorphous reset state to the partially crystalized set state or from the partially crystalized set state to the amorphous reset state. Details of the implementations may vary widely, depending on the embodiment, and should be easily understood by one of ordinary skill in the art.

Figure 4:
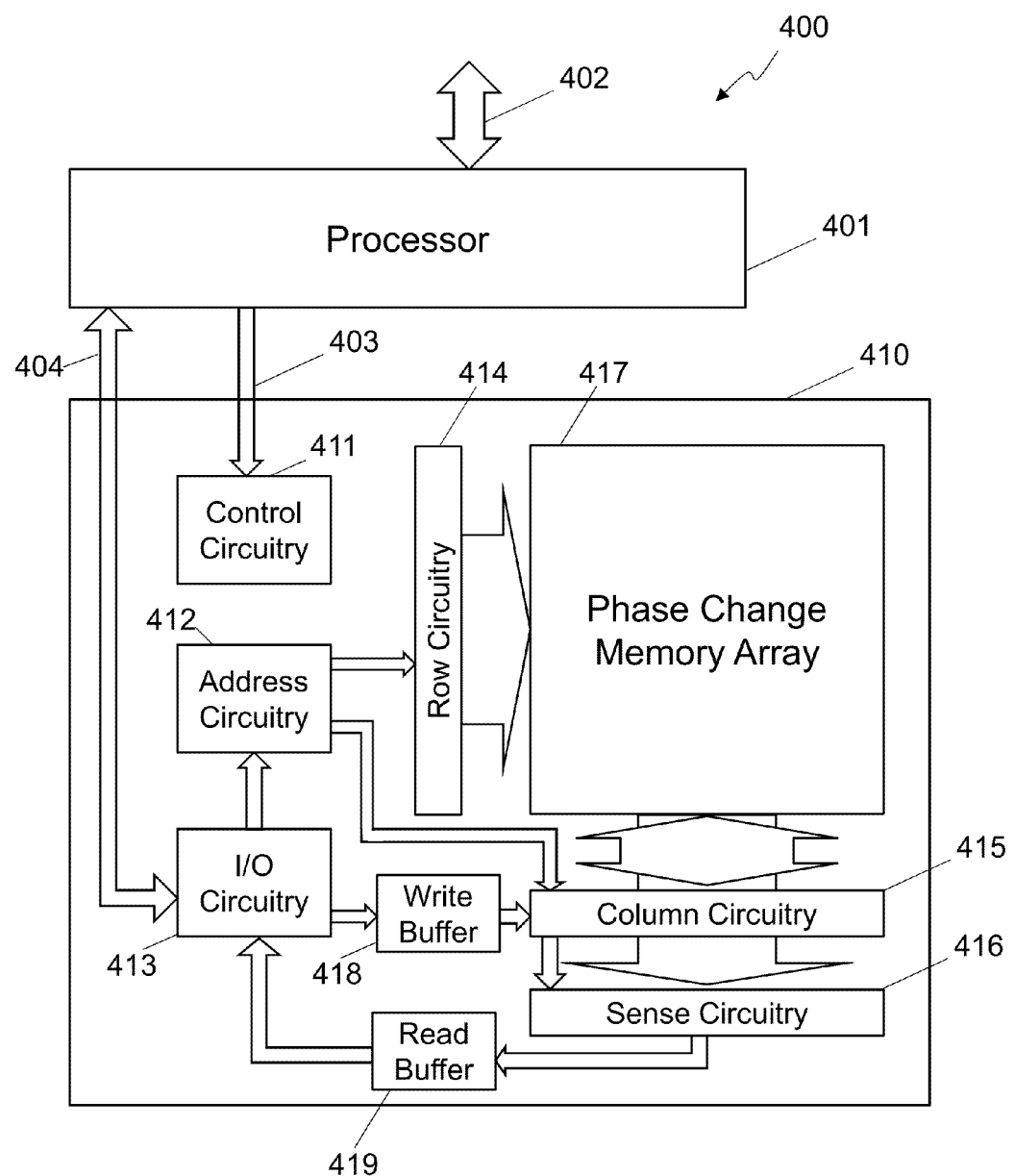
FIG. 4 shows an embodiment of a system utilizing an embodiment of phase change memory.

FIG. 4 is a block diagram of an embodiment of an electronic system 400 that includes a memory device 410 having a memory array 417 using a three dimensional NAND flash memory with self-aligned select gates. A processor 401 is coupled to the memory device 410 with control/address lines 403 and data lines 404. In some embodiments, data and control may utilize the same lines. The processor 401 may be an external microprocessor, microcontroller, or some other type of external controlling circuitry. In some embodiments, the processor 401 may be integrated in the same package or even on the same die as the memory device 410. In some embodiments, the processor 401 may be integrated with the control circuitry 411, allowing some of the same circuitry to be used for both functions. The processor 401 may have external memory, such as random access memory (RAM) and read only memory (ROM), used for program storage and intermediate data, or it may have internal RAM or ROM. In some embodiments, the processor may use the memory device 410 for program or data storage. A program running on the processor 401 may implement many different functions including, but not limited to, an operating system, a file system, defective chunk remapping, and error management.

In some embodiments an external connection 402 is provided. The external connection 402 is coupled to the processor 401 and allows the processor 401 to communicate to external devices. Additional circuitry may be used to couple the external connection 402 to the processor 401. If the electronic system 400 is a storage system, the external connection 402 may be used to provide an external device with non-volatile storage. The electronic system 400 may be a solid-state drive (SSD), a USB thumb drive, a secure digital card (SD Card), or any other type of storage system. The external connection 402 may be used to connect to a computer or other intelligent device such as a cell phone or digital camera using a standard or proprietary communication protocol. Examples of computer communication protocols that the external connection may be compatible with include, but are not limited to, any version of the following protocols: Universal Serial Bus (USB), Serial Advanced Technology Attachment (SATA), Small Computer System Interconnect (SCSI), Fibre Channel, Parallel Advanced Technology Attachment (PATA), Integrated Drive Electronics (IDE), Ethernet, IEEE-1394, Secure Digital Card interface (SD Card), Compact Flash interface, Memory Stick interface, Peripheral Component Interconnect (PCI) or PCI Express.

If the electronic system 400 is a computing system, such as a mobile telephone, a tablet, a notebook computer, a set-top box, or some other type of computing system, the external connection 402 may be a network connection such as, but not limited to, any version of the following protocols: Institute of Electrical and Electronic Engineers (IEEE) 802.3, IEEE 802.11, Data Over Cable Service Interface Specification (DOCSIS), digital television standards such as Digital Video Broadcasting (DVB)—Terrestrial, DVB-Cable, and Advanced Television Committee Standard (ATSC), and mobile telephone communication protocols such as Global System for Mobile Communication (GSM), protocols based on code division multiple access (CDMA) such as CDMA2000, and Long Term Evolution (LTE).

The memory device 410 may include an array 417 of phase change memory cells. The memory cells may be fabricated using low power phase change material as described above. Address lines and control lines 403 may be received and decoded by control circuitry 411, I/O circuitry 413 and address circuitry 412 which may provide control to the memory array 417. I/O circuitry 413 may couple to the data lines 404 allowing data to be received from and sent to the processor 401. Data read from the memory array 417 may be temporarily stored in read buffers 419. Data to be written to the memory array 417 may be temporarily stored in write buffers 418 before being transferred to the memory array 417.

The system illustrated in FIG. 4 has been simplified to facilitate a basic understanding of the features of the memory. Many different embodiments are possible including using a single processor 402 to control a plurality of memory devices 410 to provide for more storage space. Additional functions, such as a video graphics controller driving a display, and other devices for human oriented I/O may be included in some embodiments.

Unless otherwise indicated, all numbers expressing quantities of elements, optical characteristic properties, and so forth used in the specification and claims are to be understood as being modified in all instances by the term "about." The recitation of numerical ranges by endpoints includes all numbers subsumed within that range (e.g. 1 to 5 includes 1, 2.78, 3.33, and 5). Numbers should be construed in light of the number of reported significant digits and by applying ordinary rounding techniques.

As used in this specification and the appended claims, the singular forms "a", "an", and "the" include plural referents unless the content clearly dictates otherwise. Furthermore, as used in this specification and the appended claims, the term "or" is generally employed in its sense including "and/or" unless the content clearly dictates otherwise. As used herein, the term "coupled" includes direct and indirect connections. Moreover, where first and second devices are coupled, intervening devices including active devices may be located there between.

Examples of various embodiments are described in the following paragraphs:

An example of a memory may include two electrodes, and phase change material having an amorphous reset state and a partially crystalized set state, the phase change material being coupled between the two electrodes. The phase change material in the set state has a highly nonlinear current-voltage response in a subthreshold voltage region. In some examples of the memory, the phase change material may include indium, germanium and tellurium. In some examples of the memory, the phase change material may include indium, antimony, and tellurium. In some examples of the memory, the phase change material in the set state has a resistance of more than about 200 kΩ if the voltage between the two electrodes is less than about 1.5 V. In some examples of the memory, a current of less than about 1 μA flows through the phase change material in the set state if the voltage between the two electrodes is less than about 1.5 V. In some examples of the memory, a resistance of the phase change material in the set state reduces by more than an order of magnitude if a voltage across the two electrodes is increased to a threshold voltage. In some examples of the memory, a pulse of current of less than about 200 μA through the phase change material, for less than about 100 ns, changes the phase change material from the set state to the reset state. In some examples of the memory, the subthreshold voltage region may include voltage levels between about 0 V and about 2 V. Some example memories may include an access device, coupled between a control line and one of the two electrodes. In some examples of the memory, the access device is an ovonic threshold switch or a semiconductor diode. Any combination of the examples of this paragraph may be used in embodiments.

An example memory element may include two electrodes, and phase change material having an amorphous reset state and a partially crystalized set state, coupled between the two electrodes. The phase change material, by atomic percentage, may include between about 25% and about 40% indium (In), between about 1% and about 15% antimony (Sb), and between about 50% and about 70% tellurium (Te). Some example memory elements may also include an access device, coupled between a control line and one of the two electrodes. In some example memory devices, the access device is an ovonic threshold switch or a semiconductor diode.

An example system may include a processor to generate memory control commands, and at least one memory, coupled to the processor, to respond to the memory control commands. Some example systems may also include I/O circuitry, coupled to the processor, to communicate with an external device. Any combination of the examples of this paragraph and the previous two paragraphs may be used in embodiments.

The description of the various embodiments provided above is illustrative in nature and is not intended to limit this disclosure, its application, or uses. Thus, different variations beyond those described herein are intended to be within the scope of embodiments. Such variations are not to be regarded as a departure from the intended scope of this disclosure. As such, the breadth and scope of the present disclosure should not be limited by the above-described exemplary embodiments, but should be defined only in accordance with the following claims and equivalents thereof.

What is claimed is:

1. A memory comprising:
   two electrodes; and
   phase change material having an amorphous reset state and a partially crystalized set state, the phase change material being coupled between the two electrodes;
   wherein the phase change material in the set state has a highly nonlinear current-voltage response in a subthreshold voltage region.

2. The memory of claim 1, wherein the phase change material comprises indium, germanium and tellurium.

3. The memory of claim 1, wherein the phase change material comprises indium, antimony, and tellurium.

4. The memory of claim 1, wherein the phase change material in the set state has a resistance of more than about 200 kΩ if the voltage between the two electrodes is less than about 1.5 V.

5. The memory of claim 1, wherein a current of less than about 1 μA flows through the phase change material in the set state if the voltage between the two electrodes is less than about 1.5 V.

6. The memory of claim 1, wherein a resistance of the phase change material in the set state reduces by more than an order of magnitude if a voltage across the two electrodes is increased to a threshold voltage.

7. The memory of claim 1, wherein a pulse of current of less than about 200 μA through the phase change material, for less than about 100 ns, changes the phase change material from the set state to the reset state.

8. The memory of claim 1, wherein the subthreshold voltage region comprises voltage levels between about 0 V and about 2 V.

9. The memory of claim 1, further comprising an access device, coupled between a control line and one of the two electrodes.

10. The memory of claim 9, wherein the access device is an ovonic threshold switch or a semiconductor diode.

11. A system comprising:
a processor to generate memory control commands; and
at least one memory, coupled to the processor, to respond to the memory control commands, the at least one memory comprising:
two electrodes; and
phase change material having an amorphous reset state and a partially crystalized set state, the phase change material being coupled between the two electrodes;
wherein the phase change material in the set state has a highly nonlinear current-voltage response in a subthreshold voltage region.

12. The system of claim 11, wherein the phase change material comprises indium, antimony, and tellurium.

13. The system of claim 11, wherein the phase change material in the set state has a resistance of more than about 200 kΩ if the voltage between the two electrodes is less than about 1.5 V.

14. The system of claim 11, wherein a resistance of the phase change material in the set state reduces by more than an order of magnitude if a voltage across the two electrodes is increased to a threshold voltage.

15. The system of claim 11, wherein a pulse of current of less than about 200 µA through the phase change material, for less than about 100 ns, changes the phase change material from the set state to the reset state.

16. The system of claim 11, wherein the subthreshold voltage region comprises voltage levels between about 0 V and about 2 V.

17. The system of claim 11, the at least one memory further comprises an access device, coupled between a control line and one of the two electrodes.

18. The system of claim 17, wherein the access device is an ovonic threshold switch or a semiconductor diode.

19. The system of claim 11, further comprising;
I/O circuitry, coupled to the processor, to communicate with an external device.

20. A memory element comprising:
two electrodes; and
phase change material having an amorphous reset state and a partially crystalized set state, coupled between the two electrodes;
wherein the phase change material, by atomic percentage, comprises
between about 25% and about 40% indium (In);
between about 1% and about 15% antimony (Sb); and
between about 50% and about 70% tellurium (Te).

21. The memory element of claim 20, further comprising an access device, coupled between a control line and one of the two electrodes.

22. The memory element of claim 21, wherein the access device is an ovonic threshold switch or a semiconductor diode.

* * * * *